United States Patent

Bollenbeck

(10) Patent No.: US 7,583,084 B2
(45) Date of Patent: Sep. 1, 2009

(54) ARRANGEMENT FOR SIGNAL CONVERSION

(75) Inventor: Jan Bollenbeck, Eggolsheim (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/970,590

(22) Filed: Jan. 8, 2008

(65) Prior Publication Data

US 2008/0164879 A1     Jul. 10, 2008

(30) Foreign Application Priority Data

Jan. 8, 2007    (DE) ................ 10 2007 001 299

(51) Int. Cl.
*G01V 3/00* (2006.01)
(52) U.S. Cl. ........................ 324/322; 324/318
(58) Field of Classification Search ................. 324/322, 324/318
See application file for complete search history.

(56) References Cited

U.S. PATENT DOCUMENTS

| | | | |
|---|---|---|---|
| 5,160,891 A | 11/1992 | Keren | |
| 6,631,255 B1 * | 10/2003 | Claxton et al. | 455/203 |
| 6,822,445 B2 * | 11/2004 | Vester | 324/307 |
| 6,977,546 B2 * | 12/2005 | Stapleton | 330/10 |
| 7,309,989 B2 * | 12/2007 | Boskamp et al. | 324/322 |
| 7,378,844 B2 * | 5/2008 | Watkins et al. | 324/304 |

FOREIGN PATENT DOCUMENTS

| | | |
|---|---|---|
| DE | 42 00 992 A1 | 7/1993 |
| WO | WO 93/07679 | 4/1993 |
| WO | WO 2006/048816 | 5/2006 |

\* cited by examiner

*Primary Examiner*—Louis M Arana
(74) *Attorney, Agent, or Firm*—Schiff Hardin LLP

(57) ABSTRACT

In an arrangement for conversion of an analog acquisition signal of an acquisition coil of a magnetic resonance apparatus into a digital signal, the output of the acquisition coil is connected with a low-noise amplifier such that the analog acquisition signal from the acquisition coil arrives at the amplifier. The amplifier is connected at the output side with a device for analog-digital conversion, such that the analog acquisition signal arrives at the device for analog-digital conversion as an amplified acquisition signal for analog-digital conversion. The device for analog-digital conversion is designed as a delta-sigma modulator that forms a digital data stream with a width of one bit from the amplified acquisition signal.

14 Claims, 2 Drawing Sheets

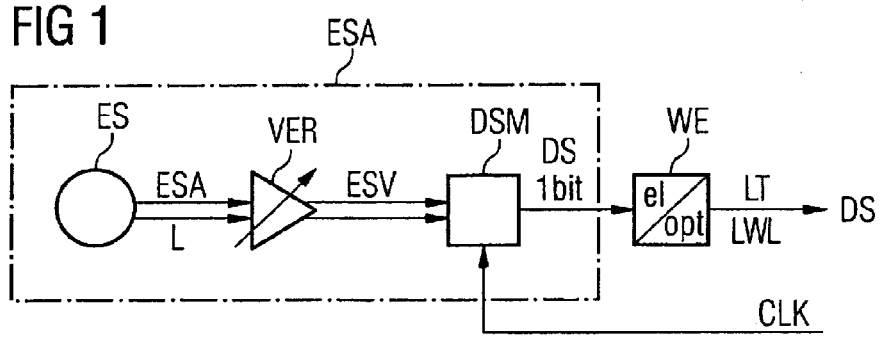
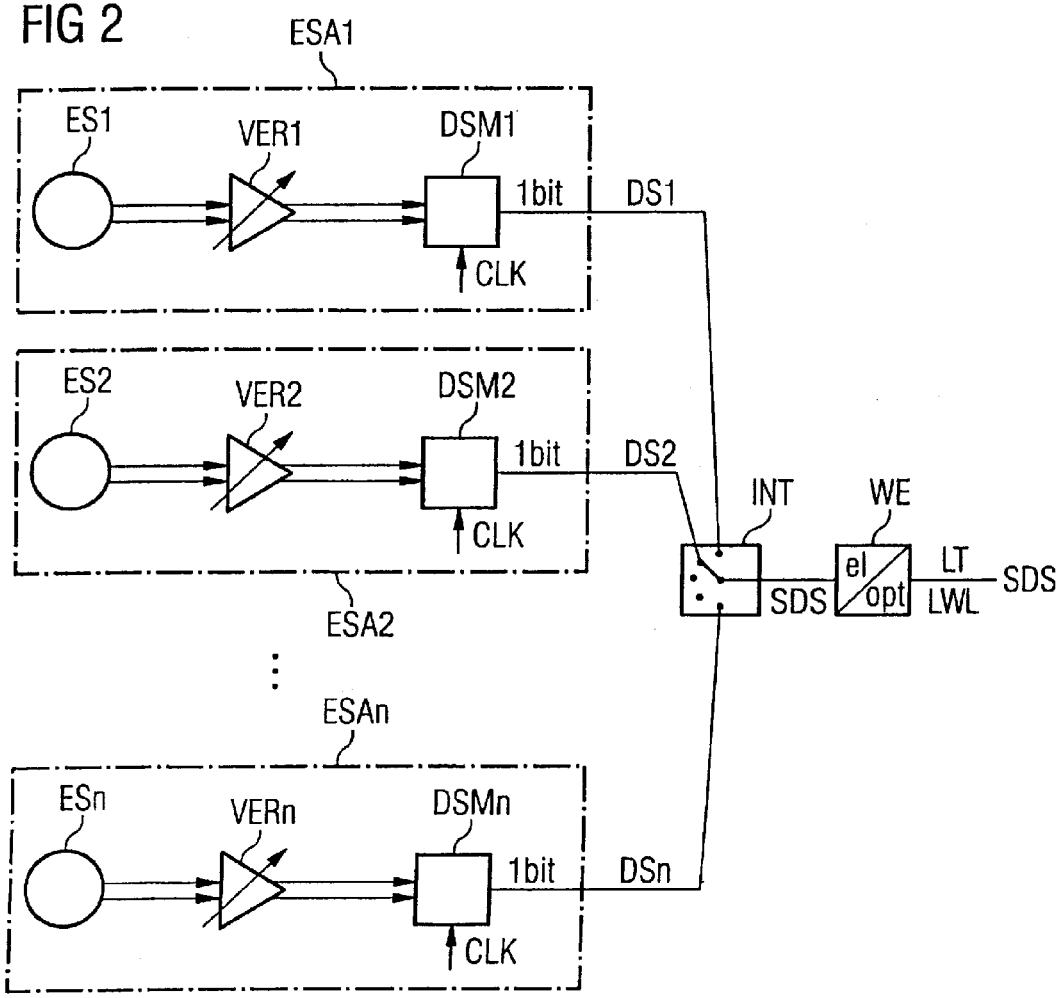

ARRANGEMENT FOR SIGNAL CONVERSION

BACKGROUND OF THE INVENTION

1. Field of the Invention

The invention concerns an arrangement for conversion of an analog acquisition signal from an acquisition coil of a magnetic resonance apparatus into a digital signal.

2. Description of the Prior Art

From WO 2006/048816 it is known to effect a conversion of analog acquisition signals of an acquisition coil of a magnetic resonance system into a digital data stream directly at the acquisition coil. An analog-digital converter is used that is spatially arranged within an acquisition region of the acquisition coil. Space-occupying and expensive coaxial cables are thus spared. Active acquisition elements are selected at the digital level, such that analog conversion electronics can advantageously be omitted. Due to the range of the signal dynamic to be processed more than 150 dB/Hz, additional stages with controllable amplification are arranged at the input of the analog-digital converter.

A disadvantage is that the heat loss from the components has an effect within the acquisition range, and a patient to be examined thus is exposed to this additional heat. A further disadvantage is that the analog-digital converters and their wiring emit interference energy due to the steep signal flanks caused by the digital signal processing, and this interference energy can generate artifacts in the examination result.

SUMMARY OF THE INVENTION

An object of the present invention is to provide an arrangement for conversion of an analog acquisition signal of an acquisition coil of a magnetic resonance apparatus in a digital signal that ensures a low heat loss in the acquisition range and with which interferences caused by digital switching flanks are reduced.

In the inventive arrangement an acquisition coil is connected at the output side with a low-noise amplifier, such that an analog acquisition or, respectively, output signal of the acquisition coil arrives at the amplifier. The amplifier is connected at the output side with delta-sigma modulator, such that the amplified analog acquisition signal is converted by the modulator into a digital data stream.

Interference power that occurs is "smeared" over a wide frequency range by the high sampling rates of the delta-sigma modulator that are used and artifacts in the examination result are thus reduced.

In comparison to other converter types, the employed delta-sigma modulator is very power-efficient and generates an extremely low heat loss or power loss.

The delta-sigma modulator is advantageously arranged in the coil housing of the acquisition coil. With this arrangement it is possible to form a 1 bit-wide data stream and to transfer this by a connection (which can advantageously be fashioned as an optical waveguide) to a spatially remote decimation filter. The decimation filter can be arranged, for example, within a "digital signal processing unit" (DSP unit). Power loss in the form of heat arises in the computationally intensive data decimation. Influencing on the patient due to the power loss is avoided by the spatial separation of the analog-digital converter and the decimation. This is particularly desirable for examinations with a large number or large density of acquisition elements.

The inventive spatial separation of the delta-sigma modulator and data decimation filter ensues at an interface at which a 1-bit data width intrinsically exists. A parallel-serial conversion in the coil housing (which conversion has conventionally been required for data transfer) that was necessary in the use of a conventional analog-digital converter is thereby avoided. Both electrical components and power loss are saved by the inventive arrangement.

Additional components are spared in an embodiment making use of temporal interleaving of a number of data streams into a resulting sum data stream.

BRIEF DESCRIPTION OF THE DRAWINGS

FIG. 1 shows a first exemplary embodiment of the invention.

FIG. 2 shows a second exemplary embodiment of the invention.

Figure 3:
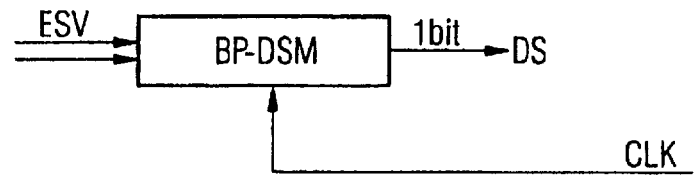
FIG. 3 shows an exemplary bandpass delta-sigma modulator for use in the inventive arrangement.

DESCRIPTION OF THE PREFERRED EMBODIMENTS.

FIG. 1 shows a first exemplary embodiment of the inventive arrangement with an acquisition signal arrangement ESA that comprises a connection of an acquisition coil ES, a low-noise amplifier with controllable amplification VER and a delta-sigma modulator DSM.

In a preferred embodiment, the acquisition coil ES is connected on the output side with the low-noise amplifier VER via a symmetrical conductor L. An analog acquisition signal ESA of the acquisition coil ES thereby arrives at the amplifier VER. This forms an amplified, analog acquisition signal ESV from the analog acquisition signal ESA.

The amplifier VER is connected on the output side with the delta-sigma modulator DSM to which the amplified, analog acquisition signal ESV is therewith connected at the input side. The delta-sigma modulator DSM forms a digital data stream DS with a width of one bit from the amplified analog acquisition signal ESV.

In an advantageous development the data stream DS is fed to a conversion device WE that here is fashioned as an electrical-optical transducer, for example. This transducer WE forms from the digital data stream DS an optical signal for a long-distance transmission, which optical signal is transferred over a conductor LT that here is exemplarily designed as an optical wave guide LWL.

For example, the transmission of the transduced data stream DS to a DSP unit (not shown here) for further processing (for example for reconversion into an electrical digital data stream and subsequent data decimation) ensues.

The decimation could be implemented with the aid of a decimation filter at a spatial distance from the acquisition signal arrangement ESA in order to keep arising power loss or heat loss away from the patient.

In an alternative embodiment, for this it is also possible to divide up the decimation filter and to arrange only a portion of this at a spatial distance from the acquisition signal arrangement ESA.

The delta-sigma modulator DSM is clocked by a signal CLK.

In an alternative embodiment (not shown here), a transduction of the data stream DS into a radio signal via the transduction device WE is possible. A radio signal transmission is then implemented in place of the conductor-bound transmission via the exemplary optical waveguide LWL.

FIG. 2 shows an inventive second exemplary embodiment of the inventive arrangement with in total n parallel acquisition signal arrangements ESA1 through ESAn.

Each of the n acquisition signal arrangements ESA1 through ESAn is designed as described in FIG. 1.

A first acquisition signal arrangement ESA1 forms a first data stream DS1 that arrives at an input of an interleaving device INT.

A second acquisition signal arrangement ESA2 forms a second data stream DS2 that arrives at a further input of an interleaving device INT.

An n-th acquisition signal arrangement ESAn forms an n-th data stream DSn that arrives at an n-th input of an interleaving device INT.

With the aid of the interleaving device INT the digital n data streams DS1 through DSn are combined (temporally interleaved) into a sum data stream SDS that is again fed to a transduction device WE for a long-distance transfer comparable to FIG. 1. The interleaving device INT runs synchronized with the signal CLK, but with a clock speed n times that of the signal clock CLK.

By this parallelized arrangement it is possible to combine acquisition signals from n acquisition coils in order to then transmit these.

The n acquisition signal arrangements ESA1 through ESAn are preferably integrated into a common housing together with the interleaving device INT and the transduction device WE.

After an occurred long-distance transmission, for example via an optical waveguide LWL, the sum data stream is again split up or "de-interleaved" into individual data streams in order to be able to implement the decimation of the individual data streams separated from one another.

FIG. 3 shows an exemplary bandpass delta-sigma modulator BP-DSM for use in the inventive arrangement.

This is fashioned such that a usable dynamic range of the delta-sigma converter is maximal at a predetermined center frequency +/− a likewise predetermined bandwidth.

The noise shape function of the delta-sigma transducer then forms a range with low noise floor in this frequency range.

The delta-sigma transducer can then convert the amplified acquisition signal ESV supplied to it directly from the acquisition frequency range.

A dimensioning of the delta-sigma modulator BP-DSM is effected for each desired frequency range of the acquisition signal.

Figure 4:
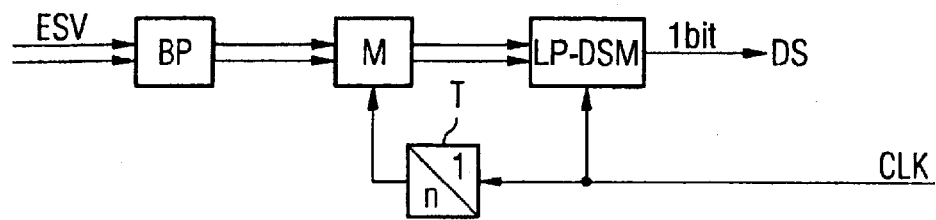
FIG. 4 shows an exemplary combination with a frequency mixer and a lowpass delta-sigma modulator for use in the inventive arrangement.

FIG. 4 shows a combination with frequency mixer and lowpass delta-sigma modulator for use in the inventive arrangement.

A bandpass BP and a mixer M are situated upstream from the lowpass delta-sigma modulator LP-DSM, such that the amplified acquisition signal ESV arrives at the lowpass delta-sigma modulator LP-DSM via the bandpass BP and via the mixer M.

The bandpass BP is designed as an image frequency [image response] filter while the mixer M can advantageously be executed as a simple pole reverser and converts the input signal to a lower frequency range.

In comparison to the bandpass delta-sigma modulator illustrated in FIG. 3, the employed lowpass delta-sigma modulator LP-DSM is easier to realize in design and in production.

An interference by noise power from neighboring acquisition frequency bands is prevented with the aid of the bandpass filter BP.

A local oscillator signal for the mixer M can be acquired from the clock signal CLK of the delta-sigma modulator via a frequency splitter T.

Figure 5:
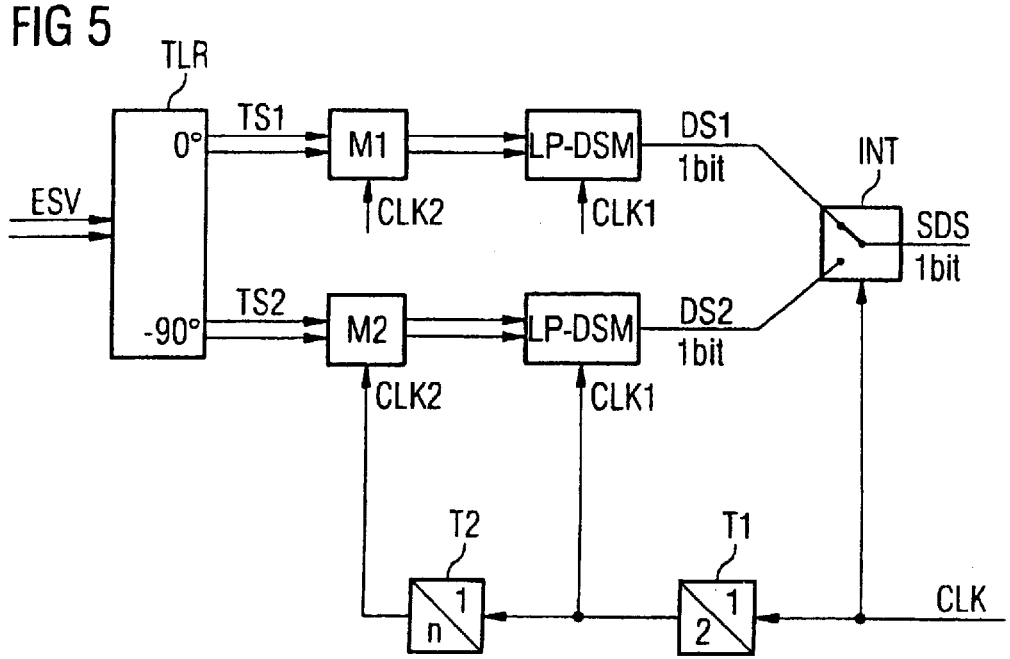
FIG. 5 shows an exemplary combination with a frequency mixer and a lowpass delta-sigma modulator as part of a quadrature mixer architecture for use in the inventive arrangement.

FIG. 5 shows an exemplary image frequency-suppressing mixer-modulator combination for use in the inventive arrangement.

The arrangement illustrated here operates according to the principle of a quadrature mixer. In comparison to FIG. 4, no bandpass is necessary as an image frequency filter since this mixer type suppresses signals in the image frequency band.

The amplified acquisition signal ESV is divided into two sub-signals TS1, TS2 in a signal splitter TLR, with both sub-signals exhibiting an identical signal level.

A first sub-signal TS1 is passed to a first mixer M1 without phase shift while a second sub-signal TS2 is passed to a second mixer M2 with 90° phase shift.

A conversion of the two sub-signals TS1 and TS2 into a lower intermediate frequency range ensues with the aid of the two structurally and functionally identical mixers M1, M2.

A lowpass delta-sigma modulator LP-DSM is respectively situated downstream from each of the two mixers M1, M2. Their output signals are again merged via an interleaver INT into a sum data stream SDS with the width of one bit.

Respective clock signals for the mixers M1, M2 and for the lowpass delta-sigma modulators LP-DSM are formed from the clock signal CLK by splitters T1 and T2.

As an alternative to the 90° phase shift implemented in the signal splitter TLR, the two clock signals CLK1, CLK2 can also be supplied with a phase offset of 90° relative to one another.

The interleaver INT is likewise clocked with the clock signal CLK.

The broadband 90° phase shift of the intermediate frequency signals relative to one another (which is necessary for the function of the quadrature mixer) and the subsequent addition of the two sub-signals is implemented in the DSP unit after the signal reconversion, the de-interleaving and the data decimation.

Since phase and amplitude errors possibly presented in the mixer arrangement or the delta-sigma modulators can be compensated in the DSP unit, a very good suppression of image frequency band portions is achieved with this arrangement.

Although modifications and changes may be suggested by those skilled in the art, it is the intention of the inventor to embody within the patent warranted hereon all changes and modifications as reasonably and properly come within the scope of his contribution to the art.

I claim as my invention:

1. An arrangement for converting an analog acquisition signal into a digital signal, comprising:
   a local coil of a magnetic resonance apparatus that acquires an analog acquisition signal;
   a low-noise amplifier having an input configured for connection to an output of the acquisition coil to receive the analog acquisition signal at the input of the amplifier, said amplifier amplifying said analog acquisition signal to form an amplified analog acquisition signal that is emitted at an output of the amplifier;

an analog-to-digital converter having an input connected to the output of the amplifier, said analog-to-digital converter converting said amplified analog acquisition signal into a corresponding digital signal that is emitted at an output of the analog-to-digital converter; and said analog-to-digital converter being a band pass delta-sigma modulator that forms a digital data stream with a width of one bit, as said digital signal, from said amplified acquisition signal.

2. An arrangement as claimed in claim 1 comprising a transduction device connected to the output of the band pass delta-sigma modulator that receives said digital data stream therefrom and transduces the digital data stream into a form suitable for long-distance transmission of said digital data stream.

3. An arrangement as claimed in claim 2 wherein said transduction device is a device selected from the group consisting of electro-optical transducers and radio interfaces.

4. An arrangement as claimed in claim 2 comprising a conductor connected to said transduction device, that is supplied with said digital data stream for said long-distance transmission thereof.

5. An arrangement as claimed in claim 4 wherein said transduction device is an electro-optical transducer and wherein said conductor is an optical waveguide.

6. An arrangement as claimed in claim 4 wherein said transduction device is connected at a first end of said conductor, and wherein said conductor has a second, opposite end, and comprising a decimation filter connected at said second end of said conductor that receives said digital data stream from said conductor and fetters said digital data stream according to a decimation function.

7. An arrangement as claimed in claim 1 wherein said acquisition coil, said amplifier and said band pass delta-sigma modulator represent a first signal acquisition circuit that has said digital data stream as a circuit output signal thereof, and wherein said arrangement comprises:

a plurality of further signal acquisition circuits identical to said first signal acquisition circuit; and an interleaving device connected to said first signal acquisition circuit and said plurality of further signal acquisition circuits that receives the respective output signals therefrom as inputs to the interleaving device; and said interleaving device forming a sum data stream from the digital data streams of the respective output signals received at said interleaving device, said interleaving device emitting said sum signal at an output of the interleaving device.

8. An arrangement as claimed in claim 7 comprising a transduction device connected to said output of said interleaving device that receives said sum data stream from said interleaving device, said transduction device transducing the sum data stream in to a form suitable for long distance transmission thereof.

9. An arrangement as claimed in claim 8 comprising a common housing that contains all of said first signal acquisition circuit, said plurality of further signal acquisition circuits, said interleaving device and said transduction device.

10. An arrangement as claimed in claim 1 wherein said acquisition coil has a coil housing, and wherein said band pass delta-sigma modulator is contained in said coil housing.

11. An arrangement as claimed in claim 1 wherein said amplifier has an adjustable amplification factor.

12. An arrangement for converting an analog acquisition signal into a digital signal, comprising:

a local coil of a magnetic resonance apparatus that acquires an analog acquisition signal;

a low-noise amplifier having an input configured for connection to an output of the acquisition coil to receive the analog acquisition signal at the input of the amplifier, said amplifier amplifying said analog acquisition signal to form an amplified analog acquisition signal that is emitted at an output of the amplifier;

an analog-to-digital converter having an input connected to the output of the amplifier, said analog-to-digital converter converting said amplified analog acquisition signal into a corresponding digital signal that is emitted at an output of the analog-to-digital converter;

said analog-to-digital converter being a delta-sigma modulator that forms a digital data stream with a width of one bit, as said digital signal, from said amplified acquisition signal;

a signal splitter having an input connected to the output of said amplifier, to which the amplified analog acquisition signal is supplied, said signal splitter forming two sub-signals, that are phase-shifted relative to each other, from said amplified analog acquisition signal;

said delta-sigma modulator comprising a first low pass delta-sigma modulator and a second low pass delta-sigma modulator;

identical first and second mixers respectively connected between said signal splitter and said first and second low pass delta-sigma modulators, a first of said sub-signals being supplied to said first low pass delta-sigma modulator via said first mixer and a second of said sub-signals being supplied to said second low pass delta-sigma modulator via said second mixer; and said first and second mixers converting the respective sub-signals into a lower intermediate frequency range.

13. An arrangement as claimed in claim 12 wherein each of said first and second low pass delta-signal modulators emits a data stream at an output thereof, and comprising an interleaver connected to the respective outputs of the first and second low pass delta-sigma modulators, said interleaver receiving the respective data streams from the first and second low pass delta-sigma modulators forming a temporally interleaved sum data stream therefrom.

14. An arrangement for converting an analog acquisition signal, into a digital signal comprising:

a local coil of a magnetic resonance apparatus that acquires an analog acquisition signal;

a low-noise amplifier having an input configured for connection to an output of the acquisition coil to receive the analog acquisition signal at the input of the amplifier, said amplifier amplifying said analog acquisition signal to form an amplified analog acquisition signal that is emitted at an output of the amplifier, said amplified analog acquisition signal having a polarity;

an analog-to-digital converter having an input connected to the output of the amplifier, said analog-to-digital converter converting said amplified analog acquisition signal into a corresponding digital signal that is emitted at an output of the analog-to-digital converter;

said analog-to-digital converter being a low pass delta-sigma modulator that forms a digital data stream with a width of one bit, as said digital signal, from said amplified acquisition signal; and a band pass filter and a mixer connected between the output of the amplifier and the input of the low pass delta sigma modulator, said mixer reversing the polarity of said amplified analog acquisition signal.

* * * * *